United States Patent
Hey-Shipton et al.

(10) Patent No.: US 10,038,424 B2
(45) Date of Patent: Jul. 31, 2018

(54) RADIO FREQUENCY FILTER, HIGH SELECTIVITY TRIPLEXER, AND COMMUNICATIONS DEVICE

(71) Applicant: Resonant Inc., Santa Barbara, CA (US)

(72) Inventors: Gregory L. Hey-Shipton, Santa Barbara, CA (US); Andrew Guyette, San Mateo, CA (US)

(73) Assignee: Resonant Inc., Santa Barbara, CA (US)

( * ) Notice: Subject to any disclaimer, the term of this patent is extended or adjusted under 35 U.S.C. 154(b) by 0 days.

(21) Appl. No.: 15/672,083

(22) Filed: Aug. 8, 2017

(65) Prior Publication Data

US 2017/0338801 A1 Nov. 23, 2017

Related U.S. Application Data

(63) Continuation of application No. PCT/US2017/025558, filed on Mar. 31, 2017.

(60) Provisional application No. 62/320,350, filed on Apr. 8, 2016.

(51) Int. Cl.
| | |
|---|---|
| *H03H 9/72* | (2006.01) |
| *H03H 9/64* | (2006.01) |
| *H03H 9/70* | (2006.01) |
| *H04B 1/40* | (2015.01) |
| *H04W 88/06* | (2009.01) |

(52) U.S. Cl.
CPC ............ *H03H 9/72* (2013.01); *H03H 9/6489* (2013.01); *H03H 9/70* (2013.01); *H04B 1/40* (2013.01); *H04W 88/06* (2013.01)

(58) Field of Classification Search
CPC ........ H03H 7/0115; H03H 9/00; H03H 9/145; H03H 9/54; H03H 9/64; H03H 9/6433; H03H 9/6489; H03H 9/70; H03H 9/72; H03H 9/725; H03H 2250/00; H04B 1/40; H04W 88/06
USPC .......................................... 333/133, 193–196
See application file for complete search history.

(56) References Cited

U.S. PATENT DOCUMENTS

| | | | |
|---|---|---|---|
| 8,701,065 | B1 | 4/2014 | Silver |
| 8,751,993 | B1 | 6/2014 | Fenzi et al. |
| 8,990,742 | B2 | 3/2015 | Turner et al. |
| 9,038,005 | B2 | 5/2015 | Turner et al. |
| 9,165,101 | B2 | 10/2015 | Turner et al. |
| 9,208,274 | B2 | 12/2015 | Turner et al. |
| 9,325,294 | B2 | 4/2016 | Silver et al. |

(Continued)

OTHER PUBLICATIONS

United States Patent & Trademark Office, International Search Report and Written Opinion for PCT Application No. PCT/US2017/025558, dated Jul. 26, 2017.

*Primary Examiner* — Robert J Pascal
*Assistant Examiner* — Jorge Salazar, Jr.
(74) *Attorney, Agent, or Firm* — SoCal IP Law Group LLP; John E. Gunther; Steven C. Sereboff

(57) ABSTRACT

Communications devices, triplexers, high-pass filters, and low-pass filters are disclosed. A communications device includes a triplexer having a common port and first, second, and third branch ports. A hybrid LC/SAW high-pass filter is connected between the common port and the third branch port, a hybrid LC/SAW low-pass filter is connected between the common port and an internal node, an LC high-pass filter is connected between the internal node and the second branch port, and an LC low-pass filter is connected between the internal node and the first branch port.

24 Claims, 12 Drawing Sheets

(56) References Cited

U.S. PATENT DOCUMENTS

| | | | |
|---|---|---|---|
| 9,331,669 B2 | 5/2016 | Costa et al. | |
| 9,369,111 B1 | 6/2016 | McHugh et al. | |
| 9,374,061 B1 | 6/2016 | Costa et al. | |
| 9,391,351 B2 | 7/2016 | Raihn et al. | |
| 9,524,360 B2 | 12/2016 | Turner et al. | |
| 9,525,393 B1 | 12/2016 | Raihn et al. | |
| 9,608,595 B1 | 3/2017 | Raihn et al. | |
| 9,654,078 B1 | 5/2017 | Raihn et al. | |
| 2003/0124984 A1* | 7/2003 | Shin | H04B 1/005 455/78 |
| 2014/0035702 A1* | 2/2014 | Black | H03H 7/075 333/186 |
| 2017/0083649 A1 | 3/2017 | Yang et al. | |

* cited by examiner

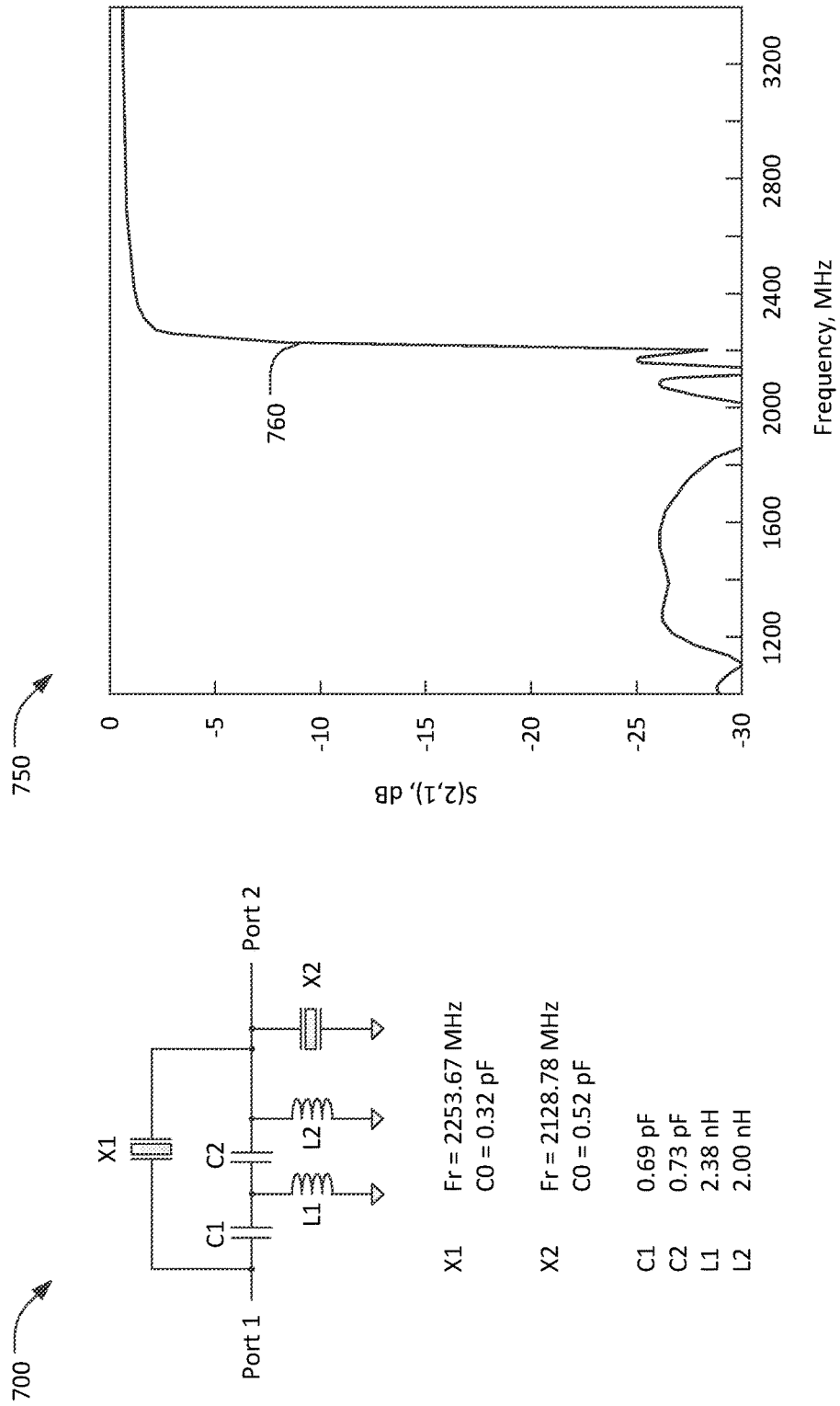

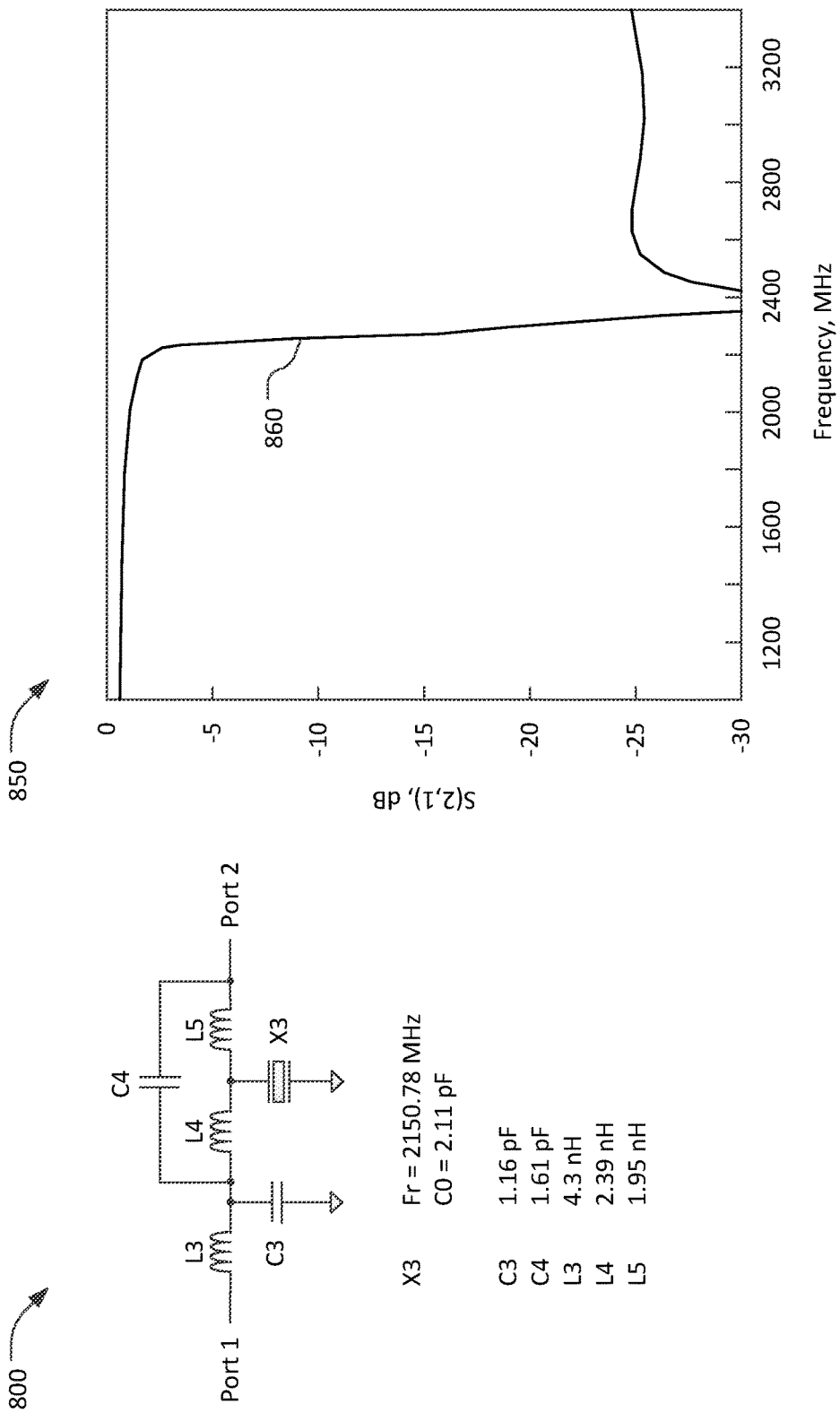

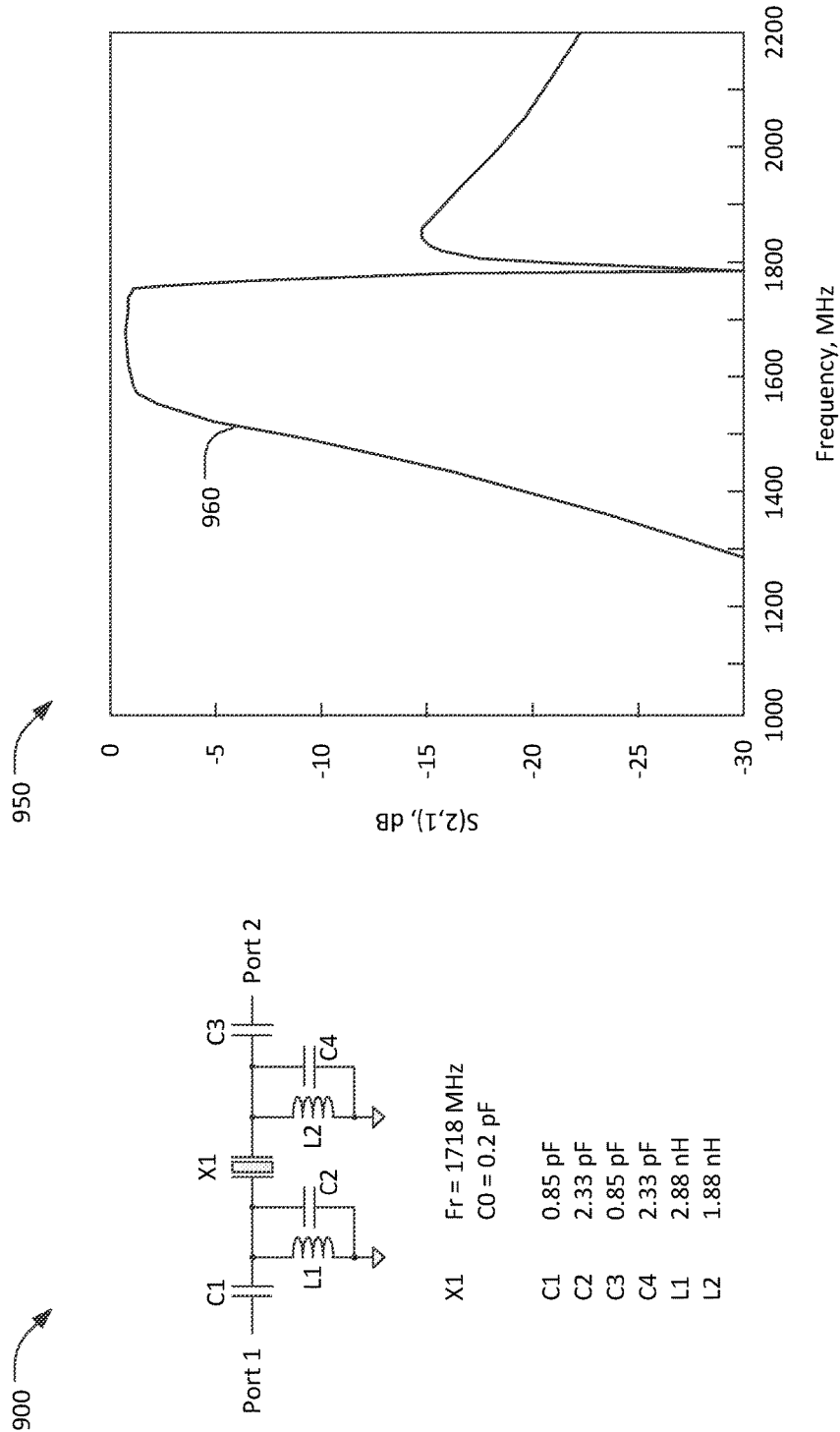

RADIO FREQUENCY FILTER, HIGH SELECTIVITY TRIPLEXER, AND COMMUNICATIONS DEVICE

RELATED APPLICATION INFORMATION

This patent is a continuation of international application PCT/US17/25558, titled RADIO FREQUENCY FILTER, HIGH SELECTIVITY TRIPLEXER, AND COMMUNICATIONS DEVICE, filed Mar. 31, 2017, which claims priority from provisional patent application 62/320,350, filed Apr. 8, 2016, titled SAW TRIPLEXER.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to radio frequency filters using surface acoustic wave (SAW) resonators, and specifically to filters and duplexers for use in communications equipment.

Description of the Related Art

A radio frequency (RF) filter is a two-terminal device configured to pass some frequencies and to stop other frequencies, where "pass" means transmit with relatively low insertion loss and "stop" means block or substantially attenuate. The range of frequencies passed by a filter is referred to as the "pass-band" of the filter. The range of frequencies stopped by such a filter is referred to as the "stop band" of the filter. A typical RF filter has at least one pass-band and at least one stop-band. Specific requirements on a pass-band or stop-band depend on the specific application. For example, a "pass-band" may be defined as a frequency range where the insertion loss of a filter is less than a defined value such as one dB, two dB, or three dB. A "stop-band" may be defined as a frequency range where the insertion loss of a filter is greater than a defined value such as twenty dB, twenty-five dB, forty dB, or greater depending on application.

RF filters are used in communications systems where information is transmitted over wireless links. For example, RF filters may be found in the RF front-ends of base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between such performance parameters as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance.

Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

Surface acoustic wave (SAW) resonators are used in a variety of RF filters including band-reject filters, band-pass filters, duplexers, and multiplexers. A duplexer is a radio frequency filter device that allows simultaneous transmission in a first frequency band and reception in a second frequency band (different from the first frequency band) using a common antenna. A multiplexer is a radio frequency filter with more than two input or output ports with multiple pass-bands. A triplexer is a four-port multiplexer with three pass-bands.

As shown in FIG. 1, a typical SAW resonator 100 is formed by thin film conductor patterns formed on a surface of a substrate 105 made of a piezoelectric material such as quartz, lithium niobate, lithium tantalate, or lanthanum gallium silicate. The substrate 105 is commonly a single-crystal slab of the piezoelectric material, or a composite substrate including a thin single-crystal wafer of the piezoelectric material bonded to another material such as silicon, sapphire, or quartz. A composite substrate is commonly used to provide a thermal expansion coefficient different from the thermal expansion coefficient of the single-crystal piezoelectric material alone. A first inter-digital transducer (IDT) 110 includes a plurality of parallel conductors. A radio frequency or microwave signal applied to the first IDT 110 via an input terminal IN generates an acoustic wave on the surface of the substrate 105. As shown in FIG. 1, the surface acoustic wave will propagate in the left-right direction. A second IDT 120 converts the acoustic wave back into a radio frequency or microwave signal at an output terminal OUT. The conductors of the second IDT 120 are interleaved with the conductors of the first IDT 110 as shown. In other typical SAW resonator configurations (not shown), the conductors forming the second IDT are disposed on the surface of the substrate 105 adjacent to, or separated from, the conductors forming the first IDT. Also, extra fingers (commonly called "dummy" fingers) are sometimes formed opposite to the ends of the IDT fingers and connected to the IN and OUT bus bars of the first and second IDTs 110 and 120. Grating reflectors 130, 135 are disposed on the substrate to confine most of the energy of the acoustic waves to the area of the substrate occupied by the first and second IDTs 110, 120. The grating reflectors 130, 135 float or are connected to either the IN terminal or the OUT terminal. In general, the SAW resonator 100 is bi-directional, and the IN and OUT terminal designations may be transposed.

The electro-acoustic coupling between the first IDT 110 and the second IDT 120 is highly frequency-dependent. The basic behavior of acoustic resonators (SAW, bulk acoustic wave, film bulk acoustic wave, etc.) is commonly described using the Butterworth Van Dyke (BVD) circuit model as shown in FIG. 2A. The BVD circuit model consists of a motional arm and a static arm. The motional arm includes a motional inductance $L_m$, a motional capacitance $C_m$, and a resistance $R_m$. The static arm includes a static capacitance $C_0$ and a resistance $R_0$. While the BVD model does not fully describe the behavior of an acoustic resonator, it does a good job of modeling the two primary resonances that are used to design band-pass filters, duplexers, and multiplexers (multiplexers are filters with more than 2 input or output ports with multiple pass-bands).

The first primary resonance of the BVD model is the motional resonance caused by the series combination of the motional inductance $L_m$ and the motional capacitance $C_m$. The second primary resonance of the BVD model is the anti-resonance caused by the combination of the motional inductance $L_m$, the motional capacitance $C_m$, and the static capacitance $C_0$. In a lossless resonator ($R_m=R_0=0$), the frequency $F_r$ of the motional resonance is given by $$F_r = \frac{1}{2\pi\sqrt{L_m C_m}} \quad (1)$$

The frequency $F_a$ of the anti-resonance is given by $$F_a = F_r\sqrt{1 + \frac{1}{\gamma}} \quad (2)$$

where $\gamma = C_0/C_m$ is a characteristic of the substrate upon which the SAW resonator is fabricated. $\gamma$ is dependent on both the material and the orientation of the crystalline axes of the substrate, as well as the physical design of the IDTs.

The frequencies of the motional resonance and the anti-resonance are determined primarily by the pitch and orientation of the interdigitated conductors, the choice of substrate material, and the crystallographic orientation of the substrate material.

FIG. 2B is a plot of the admittance of a theoretical lossless acoustic resonator. The admittance exhibits a motional resonance 212 where the admittance of the resonator approaches infinity, and an anti-resonance 214 where the admittance of the resonator approaches zero. In over-simplified terms, the lossless acoustic resonator can be considered a short circuit at the frequency of the motional resonance 212 and an open circuit at the frequency of the anti-resonance 214. The frequencies of the motional resonance 212 and the anti-resonance 214 are representative, and a resonator may be designed for other frequencies.

Cellular telephones operate in various bands defined by industry or governmental standards. For example, the 3GPP LTE (Third Generation Partnership Project Long Term Evolution) standard defines 48 different bands over a frequency range of about 450 MHz to greater than 5000 MHz. Each of these bands consists of a frequency range or a pair of disjoint frequency ranges used for cellular telephone communications. For example, Band 12, which is used in the United States and Canada, employs the frequency range from 699 MHz to 716 MHz for communications from the cellular device to the cellular network and the frequency range from 729 MHz to 746 MHz for communications from the network to the device. Band 40, used in several countries in Asia, employs the frequency range from 2300 MHz to 2400 MHz for communications in both directions. All of bands defined by the 3GPP LTE standard are not currently in use, and only one or a few bands are typically used in any particular country. Further, different cellular service providers in a given country may each have frequency allocations within one or multiple bands.

Carrier aggregation is a technique to increase data rates by transmitting multiple signals or carriers to a cellular phone. The multiple signals may be within the same band or in multiple bands in situations where the service provider has frequency allocations in multiple bands.

To allow international roaming, it is desirable for cellular phones to be capable of operating in as many frequency bands as possible. Further, to facilitate carrier aggregation, it is desirable for cellular phones to be capable of simultaneous operation in multiple frequency bands.

DESCRIPTION OF THE DRAWINGS

FIG. 7A is a schematic diagram of another exemplary hybrid LC/SAW high-pass filter.

FIG. 7B is a chart showing S(2,1) of the exemplary hybrid LC/SAW high-pass filter of FIG. 7A.

FIG. 8A is a schematic diagram of an exemplary hybrid LC/SAW low-pass filter.

FIG. 8B is a chart showing S(2,1) of the exemplary hybrid LC/SAW low-pass filter of FIG. 8A.

FIG. 9A is a schematic diagram of an exemplary hybrid LC/SAW band-pass filter.

FIG. 9B is a chart showing S(2,1) of the exemplary hybrid LC/SAW band-pass filter of FIG. 9A.

Throughout this description, elements appearing in figures are assigned three-digit reference designators, where the most significant digit is the figure number where the element is first shown and the two least significant digits are specific to the element. An element that is not described in conjunction with a figure may be presumed to have the same characteristics and function as a previously-described element having the same reference designator.

DETAILED DESCRIPTION

Description of Apparatus

Figure 3:
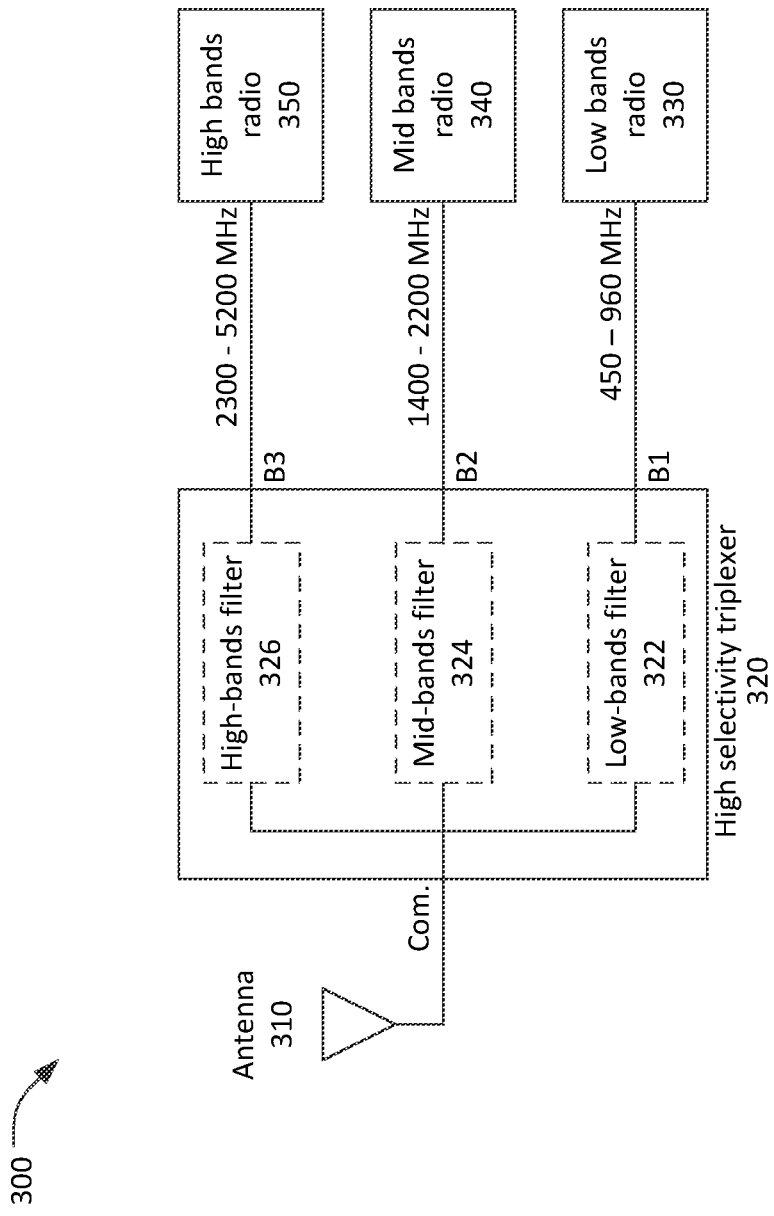
FIG. 3 is a block diagram of a communication device including a triplexer.

FIG. 3 is a block diagram of a multi-band communications device 300. The communication device 300 includes an antenna 310, a high selectivity triplexer 320, and three radios. The triplexer 320 has a common port (Com.) and three branch ports (B1, B2, B3). The common port is coupled to the antenna 310. The first branch port B1 is coupled to a low-bands radio 330 is configured to operate in frequency bands (i.e. bands 5, 8, 12, 13, 17, 20, 28, 31, etc.) between 450 MHz and 960 MHz. The second branch port B2 is coupled to a mid-bands radio 340 is configured to operate in frequency bands (i.e. bands 1, 2, 3, 4, 25, 66, etc.) between 1400 MHz or 1500 MHz and 2200 MHz. The third branch port B3 is coupled to a high-bands radio 350 is configured to operate in frequency bands (i.e. bands 7, 30, 38, 40, 41, 42, 43, etc.) between 2300 MHz and 3500 MHz or higher. The division of the frequency spectrum into "low bands," "mid bands," and "high bands" is driven in part by the fact that the frequency ranges from 960 MHz to 1420 MHz and 2200 MHz to 2300 MHz are not used by any defined cellular communications band.

The triplexer 320 functions as three filters—a low-bands filter 322 coupled between the common port and the first branch port, a mid-bands filter 324 coupled between the common port and the second branch port, and a high-bands filter 326 coupled between the common port and the third branch port. The low-bands filter 322 has a pass band of 450 MHz to 960 MHz and stop bands of 1400 MHz to 2200 MHz and 2300 MHz to greater than 3500 Mhz. The mid-bands filter 324 has a pass band of 1400 MHz to 2200 MHz and stop bands of 450 MHz to 960 MHz and 2300 MHz to greater than 3500 Mhz. The high-bands filter 326 has a pass band of 2300 MHz to greater than 3500 MHz and stop bands of 450 MHz to 960 MHz and 1400 MHz to 2200 Mhz. While the function of triplexer 320 may be described as three band-pass filters, the internal structure of the triplexer may be a combination of band-pass, low-pass, high-pass, and band-reject filters.

The triplexer 320 may be described as "highly selectivity" because the transition region between the high bands frequency range and the mid bands frequency range is only 100 MHz, or less than 5% of the frequency at the edges of those bands.

Each of the low-bands radio 330, mid-bands radio 340, and high-bands radio 350 includes one or more transmitter and one or more receiver, and may include one or multiple filters, duplexers, switches, processors, and other components to allow the radio to communicate over one or more bands within the respective frequency range.

Figure 4:
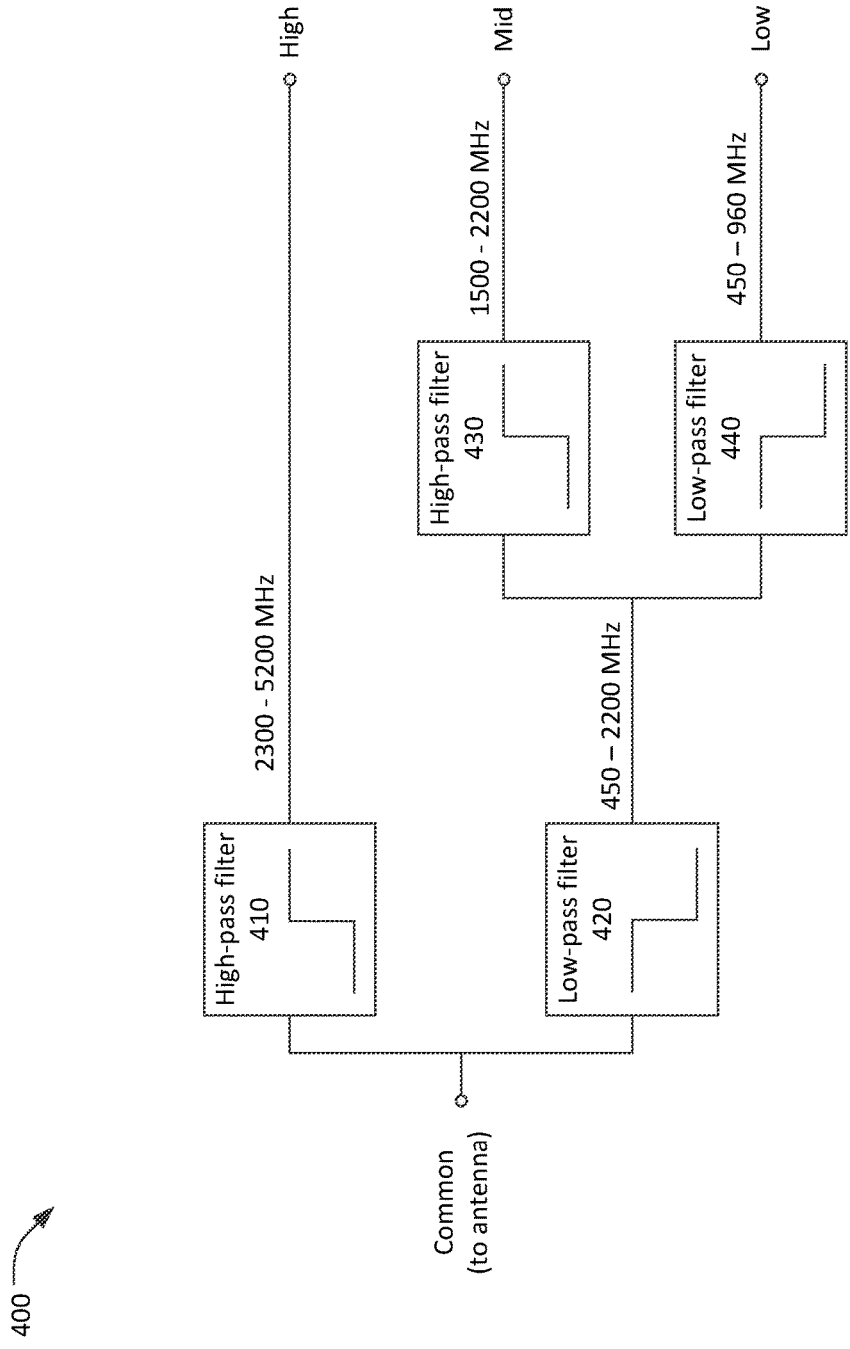
FIG. 4 is a block diagram of an exemplary triplexer for use in the communication device of FIG. 3.

FIG. 4 is a block diagram of a highly selective triplexer 400 suitable for use as the triplexer 320 in the communication device 300 of FIG. 3. A common port is connected to a first high-pass filter 410 and a first low-pass filter 420. The first high-pass filter 410 is configured to pass frequencies above 2300 MHz with low insertion loss and to stop, or substantially attenuate, frequencies below 2200 MHz. Typical specifications for the first high-pass filter 410 may include an insertion loss of less than 3 dB at frequencies between 2300 MHz and at least 3500 MHz, and insertion loss greater than 25 dB for frequencies below 2200 MHz. Conversely, the first low-pass filter 420 is configured to pass frequencies below 2200 MHz with low insertion loss and to stop frequencies above 2300 MHz. Typical specifications for the first low-pass filter 420 may include an insertion loss of less than 3 dB at frequencies below 2200 MHz, and insertion loss greater than 25 dB for frequencies above 2300 MHz.

The output of the low pass filter 420 is further divided into mid and low frequency ranges by a second high-pass filter 430 and a second low-pass filter 440. The second high-pass filter 430 is configured to pass frequencies between 1400 MHz and at least 2200 MHz with low insertion loss and to reject, or substantially attenuate, frequencies below 960 MHz. The second low-pass filter 440 is configured to pass frequencies between 450 MHz and 960 MHz with low insertion loss and to reject, or substantially attenuate, frequencies between 1400 MHz and 2200 MHz.

Acoustic resonators, such as the previously described SAW resonator, are capable of providing high resonant Q (quality factor) in a small component volume. Such resonators are commonly used in high-selectivity narrow-bandwidth band-pass filters and duplexers for use in communications devices. However, the inherent coupling between the resonance and anti-resonance of acoustic resonators limits the realizable bandwidth. Conversely, passive reactive components such as capacitors, inductors, phase shifters, and other passive elements can be used to realize filters with arbitrary bandwidth, but low selectivity due to the limited Q of such components. Such filters will be referred to herein as LC filters (L and C being the conventional designators for inductors and capacitors, respectively, in electronic schematic diagrams).

Figure 5:
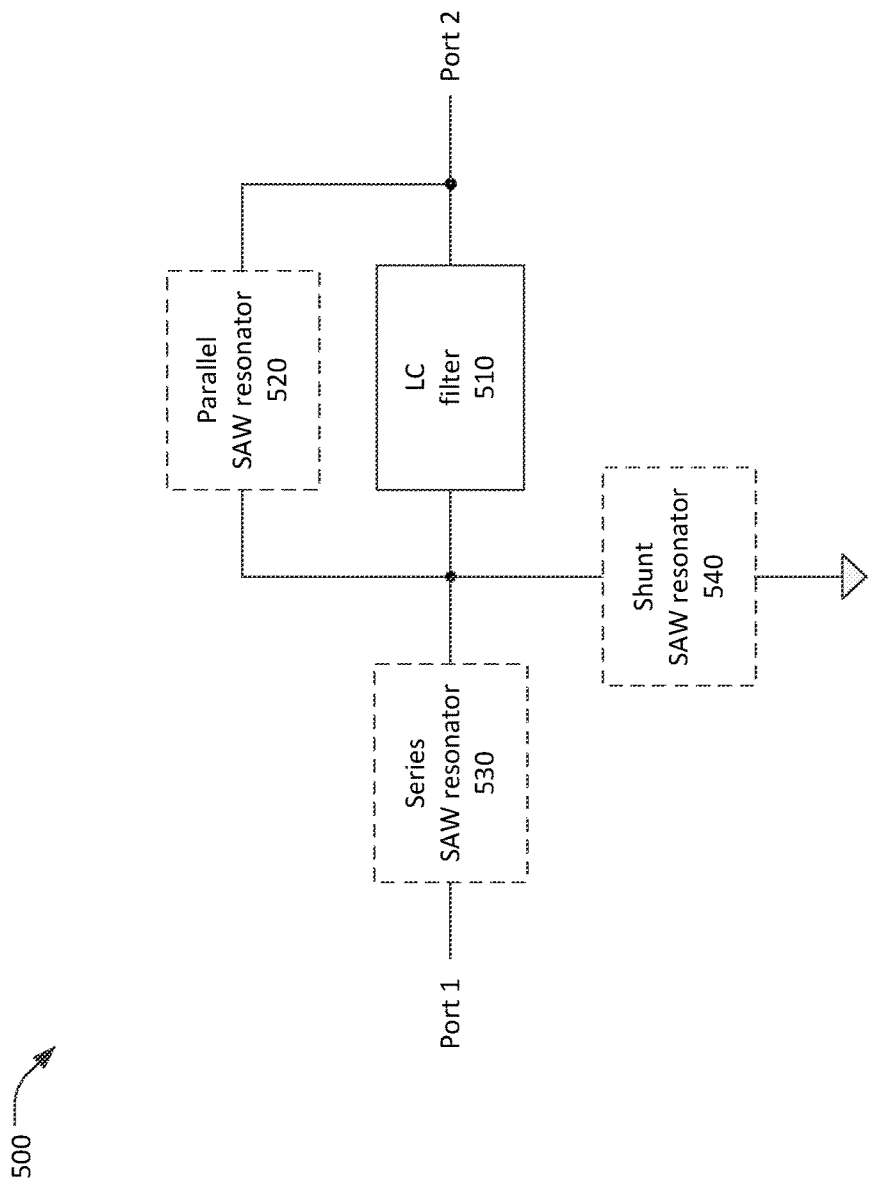
FIG. 5 is a block diagram of a hybrid LC/SAW filter.

FIG. 5 is a conceptual diagram of a hybrid LC/SAW filter 500 including a low Q LC filter 510 and at least one high Q SAW resonator. In this context, the terms "low Q" and "high Q" are relative, indicating that the Q of the SAW resonator is substantially higher that the Q of the LC filter. The Q of the LC filters 510 is typically determined by the Q of the inductors within the filter, which may be, for example, about 100. The Q of the SAW resonator 520/530/540 may be, for example, greater than 1000.

The SAW resonator may be a parallel resonator 520 connected in parallel with all or a portion of the LC filter 510. The SAW resonator may be a series resonator 530 connected in series with the LC filter 510. The SAW resonator may be a shunt resonator 540 connected between ground and one of Port 1, Port 2, or an internal node within the LC filter 510. In some hybrid LC/SAW filters, more than one of the parallel resonator 520, series resonator 530, and shunt resonator 540 may be present. In some hybrid LC/SAW filters, two or more parallel resonators, series resonators, or shunt resonators may be present.

The LC filter 510 has at least one pass-band and at least one stop-band that define the function (high-pass, low-pass, band-pass, etc.) of the hybrid LC/SAW filter 500. Adjacent (in frequency) pass-bands and stop-bands are separated by a transition frequency region. The LC filter 510, and other LC filters to be discussed subsequently, may be implemented using discrete, printed, or distributed capacitors and inductors and combinations thereof. Printed and distributed components may be formed using thin-film conductors and insulators, low temperature co-fired ceramic (LTCC) conductors and insulators, or some other component fabrication technology.

Figure 1:
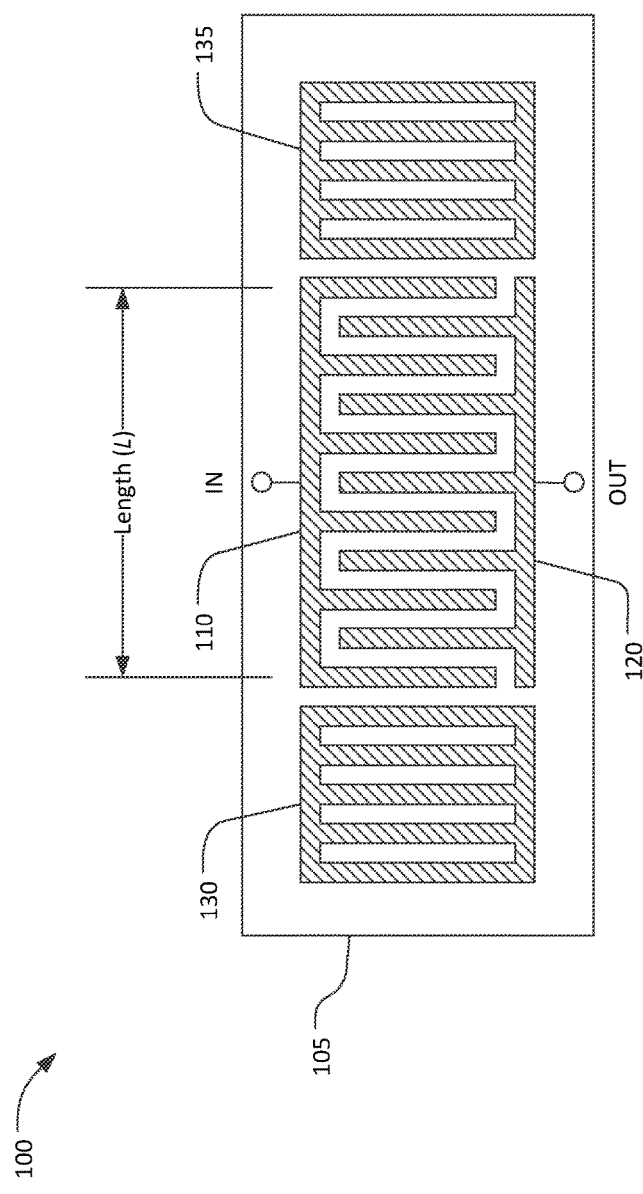
FIG. 1 is a simplified schematic plan view of a SAW resonator.
Figure 2B:
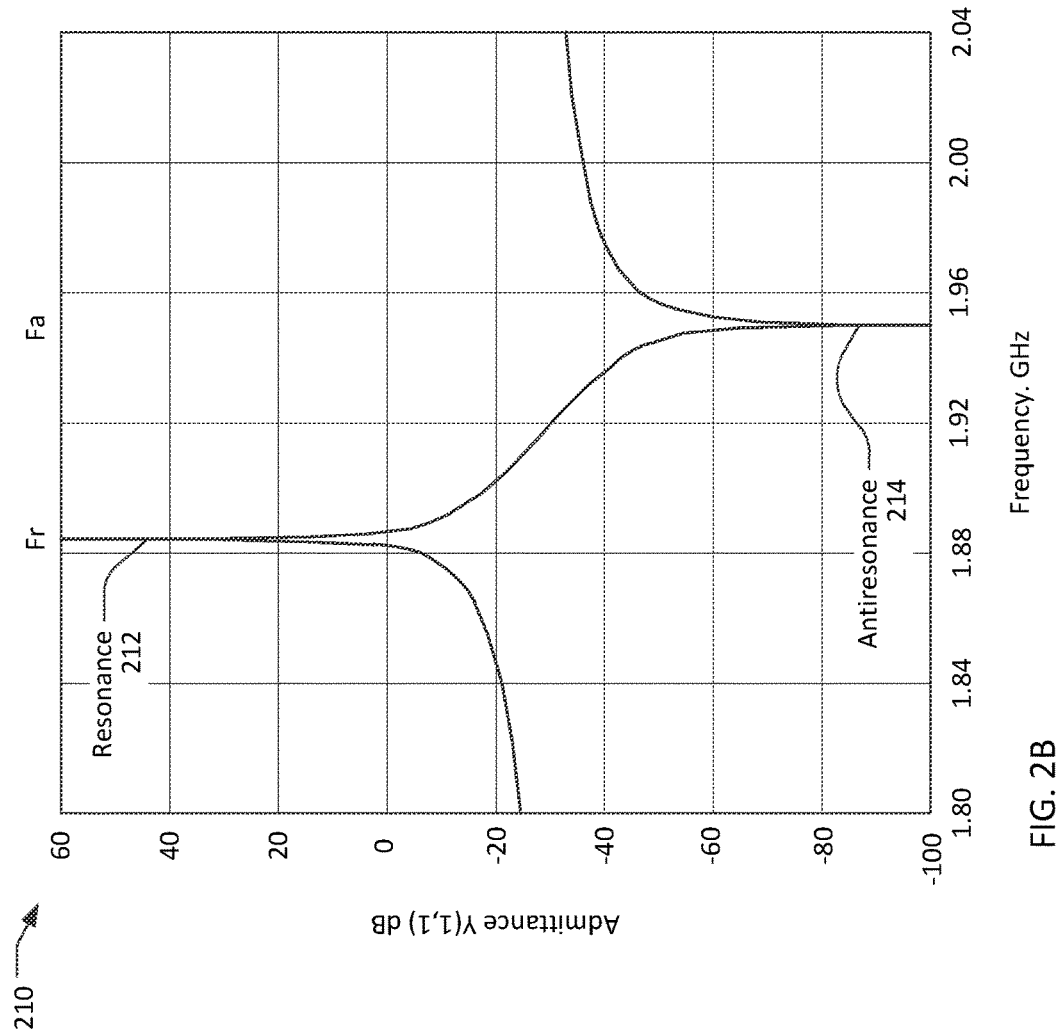
FIG. 2B is graph of the admittance of a lossless SAW resonator.
Figure 2A:
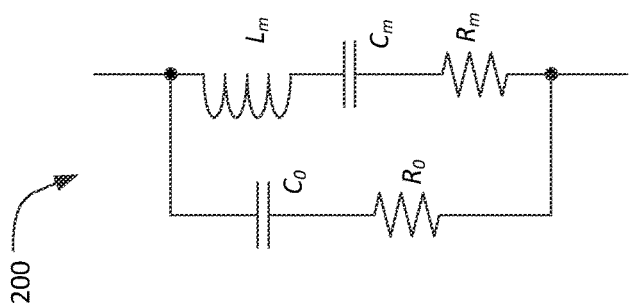
FIG. 2A is an equivalent circuit of a SAW resonator.

The SAW resonator 520/530/540 is configured to improve the selectivity of the overall hybrid LC/SAW filter 500 by sharpening a transition between a pass-band and a stop-band of the LC filter 510. As shown in FIG. 2B, a SAW resonator has very high admittance at its resonant frequency and very low admittance at its anti-resonance frequency. In simplified terms, a SAW resonator may be considered as a short circuit at the resonance frequency and an open circuit at the anti-resonance frequency.

A parallel SAW resonator 520 can improve the selectivity of the LC filter 510 if the resonant frequency of the SAW resonator is within a transition region of the LC filter. In this case, energy at the resonant frequency, which would only be partially transmitted through the LC filter in the absence of the SAW resonator, bypasses the LC filter via the SAW resonator.

A series SAW resonator 530 can improve the selectivity of the LC filter 510 if the anti-resonant frequency of the SAW resonator is within a transition region of the LC filter. In this case, energy at the resonant frequency, which would be partially transmitted through the LC filter in the absence of the SAW resonator, is blocked by the SAW resonator.

A shunt SAW resonator 540 can improve the selectivity of the LC filter 510 if the resonant frequency of the SAW resonator is within a transition region of the LC filter. In this case, energy at the resonant frequency, which would be partially transmitted through the LC filter in the absence of the SAW resonator, is shorted to ground by the SAW resonator.

EXAMPLE 1

Figure 6B:
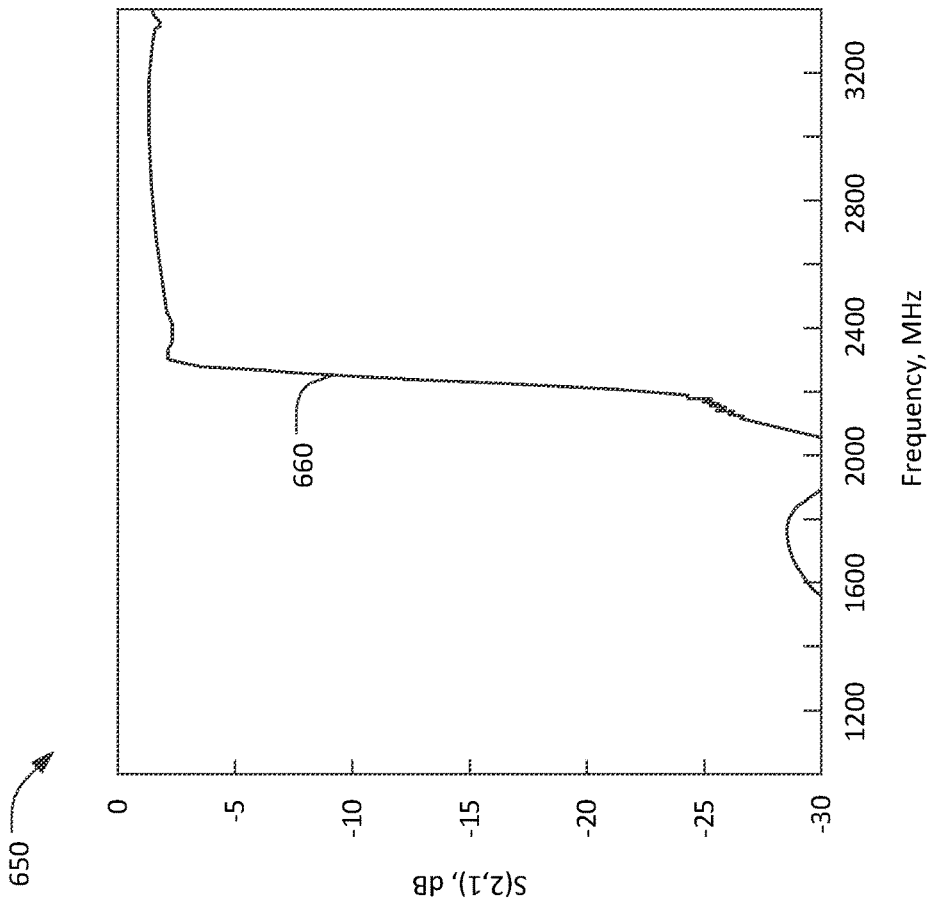
FIG. 6B is a chart showing S(2,1) of the exemplary hybrid LC/SAW high-pass filter of FIG. 6A.
Figure 6A:
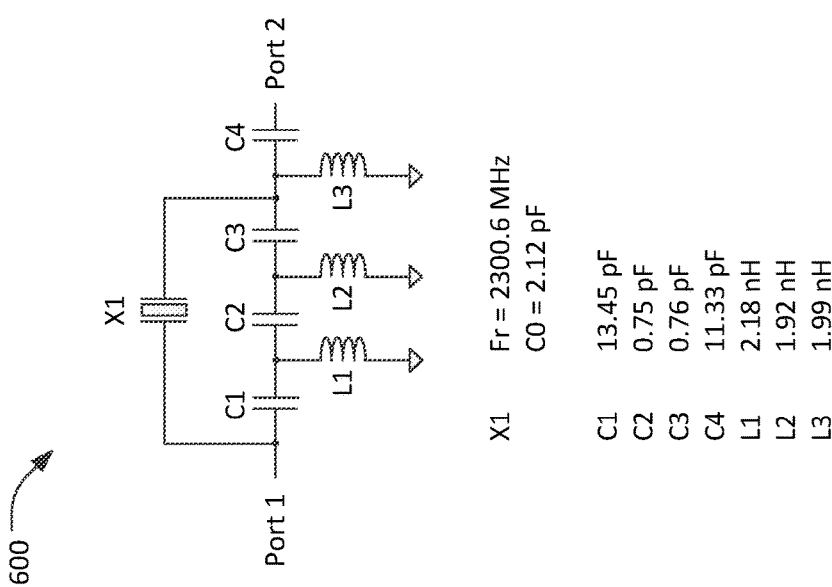
FIG. 6A is a schematic diagram of an exemplary hybrid LC/SAW high-pass filter.

FIG. 6A is a schematic diagram of a hybrid LC/SAW high-pass filter 600. The hybrid LC/SAW high-pass filter 600 includes an LC high-pass filter implemented using four capacitors C1-C4 and three inductors L1-L3, and a parallel SAW resonator X1. The four capacitors C1-C4 may be described as "series" elements because they are coupled in series between the two ports of the filter 600. The three inductors L1-L3 may be described as "shunt" elements because they a coupled between the series elements and ground and act to shunt certain signals to ground. A high-pass LC filter commonly includes series capacitors and shunt inductors. Conversely, a low-pass LC filter commonly includes series inductors and shunt capacitors.

FIG. 6B is a graph of the S(2,1) of the hybrid LC/SAW high-pass filter 600 as derived by simulation of the circuit of FIG. 6A. S-parameters are a convention used to describe the performance of linear electrical networks. The solid line 660 is a plot of S(2,1), which is the voltage transfer function from port 1 to port 2 of an electrical network. S(2,1) is often expressed in dB, which is 20 $\log_{10}[S(2,1)]$, and is essentially the power gain of the device. However, passive devices like filters are usually characterized by the "insertion loss" of the filter, which is numerically the same as the power gain, but with a change in numeric sign (e.g. S(2,1)=−3 dB is equivalent to an insertion loss of 3 dB). In this case, the solid line 660 plots the input-to-output transfer function of the filter 600. The hybrid LC/SAW high-pass filter 600 provides less than 3 dB loss at frequencies above 2300 MHz and greater than 25 dB attenuation at frequencies less than 2190 MHz.

EXAMPLE 2

FIG. 7A is a schematic diagram of another hybrid LC/SAW high-pass filter 700. The hybrid LC/SAW high-pass filter 700 includes an LC high-pass filter implemented using two series capacitors C1-C2 and two shunt inductors L1-L2 and a parallel SAW resonator X1 and a shunt SAW resonator X2.

FIG. 7B is a graph of the S(2,1) of the hybrid LC/SAW high-pass filter 700 as derived by simulation of the circuit of FIG. 7A. The solid line 760 is a plot of the input-output transfer function of the hybrid LC/SAW high-pass filter 700. The hybrid LC/SAW high-pass filter 700 provides less than 2 dB loss at frequencies above 2300 MHz and greater than 25 dB attenuation at frequencies less than 2210 MHz.

EXAMPLE 3

Hybrid LC/SAW filters are not limited to just high-pass filters. FIG. 8A is a schematic diagram of a hybrid LC/SAW low-pass filter 800. Inductor L3 and capacitor C3 are an LC low pass filter section in series with a "bridged-T" circuit made up of capacitor C4, inductors L4 and L5, and SAW resonator X3. Inductors L4 and L5 and shunt SAW resonator X3 make up the "T", and capacitor C4 is the "bridge." SAW resonator X3 is substituted for what would be another capacitor in a conventional bridged-T circuit. The SAW resonator X3 effectively improves the selectivity of the LC low pass filter by shunting signals within the transition frequency range of the LC low-pass filter to ground.

FIG. 8B is a graph of the S(2,1) of the hybrid LC/SAW low-pass filter 800 as derived by simulation of the circuit of FIG. 8A. The solid line 860 is a plot of the input-output transfer function of the hybrid LC/SAW low-pass filter 800. The hybrid LC/SAW high-pass filter 800 provides less than 2 dB loss at frequencies below 2200 MHz and greater than 25 dB attenuation at frequencies above 2330 MHz.

EXAMPLE 4

FIG. 9A is a schematic diagram of a hybrid LC/SAW band-pass filter 900. A series SAW resonator X1 is connected in series with two LC band-pass filter sections. The series SAW resonator X1 effectively improves the selectivity of the LC band-pass filter by blocking signals at the anti-resonance frequency of the resonator (about 1785 MHz), which is within the transition frequency range on the upper side of the LC filter pass-band.

FIG. 9B is a graph of the S(2,1) of the hybrid LC/SAW band-pass filter 900 as derived by simulation of the circuit of FIG. 9A. The solid line 960 is a plot of the input-output transfer function of the hybrid LC/SAW low-pass filter 900.

EXAMPLE 5

Figures 10A, 10B:
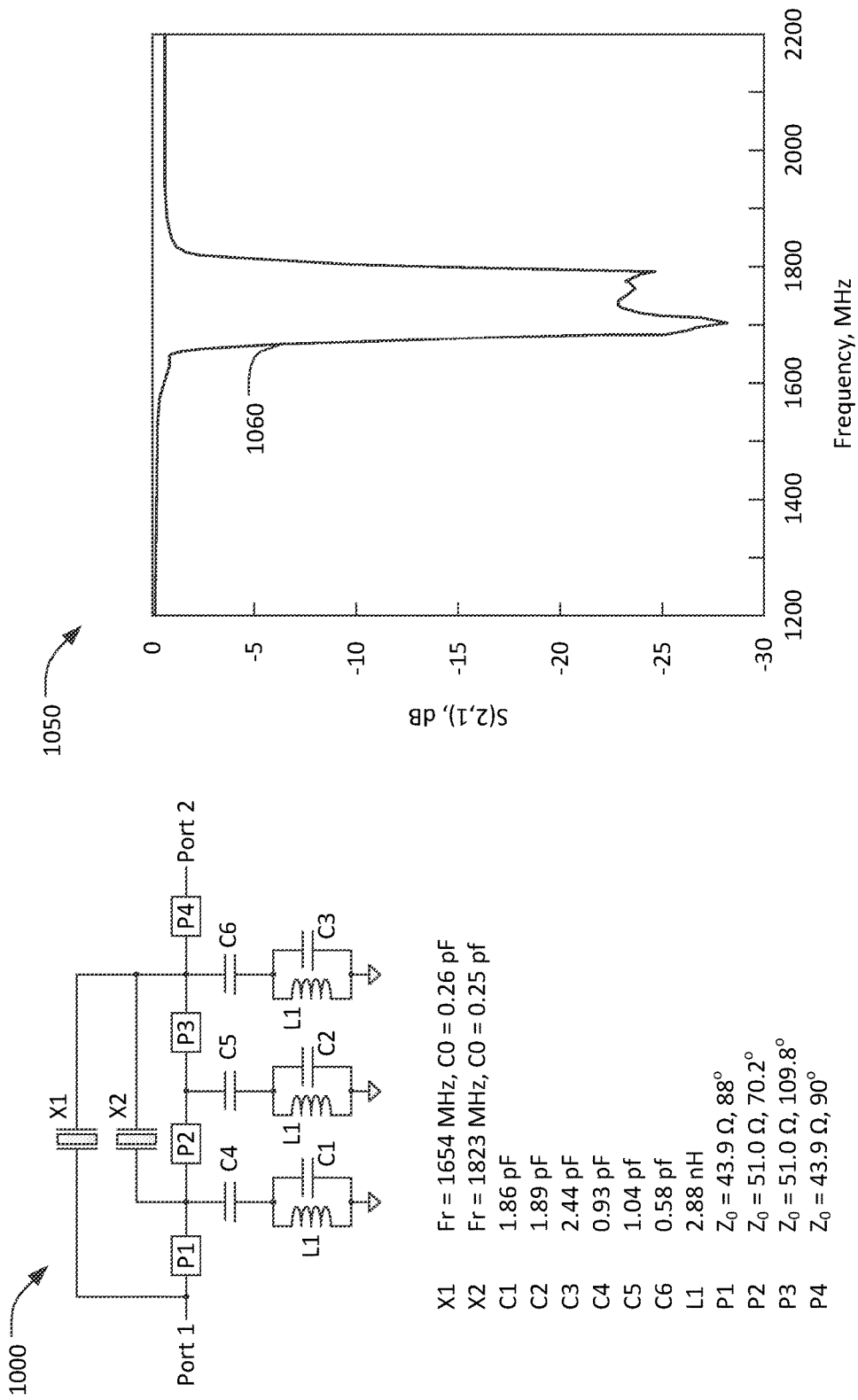
FIG. 10A is a schematic diagram of an exemplary hybrid LC/SAW band-stop filter.
FIG. 10B is a chart showing S(2,1) of the exemplary hybrid LC/SAW band-stop filter of FIG. 10A.

FIG. 10A is a schematic diagram of a hybrid LC/SAW band-stop filter 1000, which includes two SAW resonators X1 and X2 and parallel with portions of an LC band-stop filter. The LC band stop filter includes phase shift elements P1, P2, P3, P4, which may be implemented, for example, by lengths of transmission line.

FIG. 10B is a graph of the S(2,1) of the hybrid LC/SAW band-stop filter 1000 as derived by simulation of the circuit of FIG. 10A. The solid line 1060 is a plot of the input-output transfer function of the hybrid LC/SAW low-pass filter 1000.

EXAMPLE 6

Figure 11:
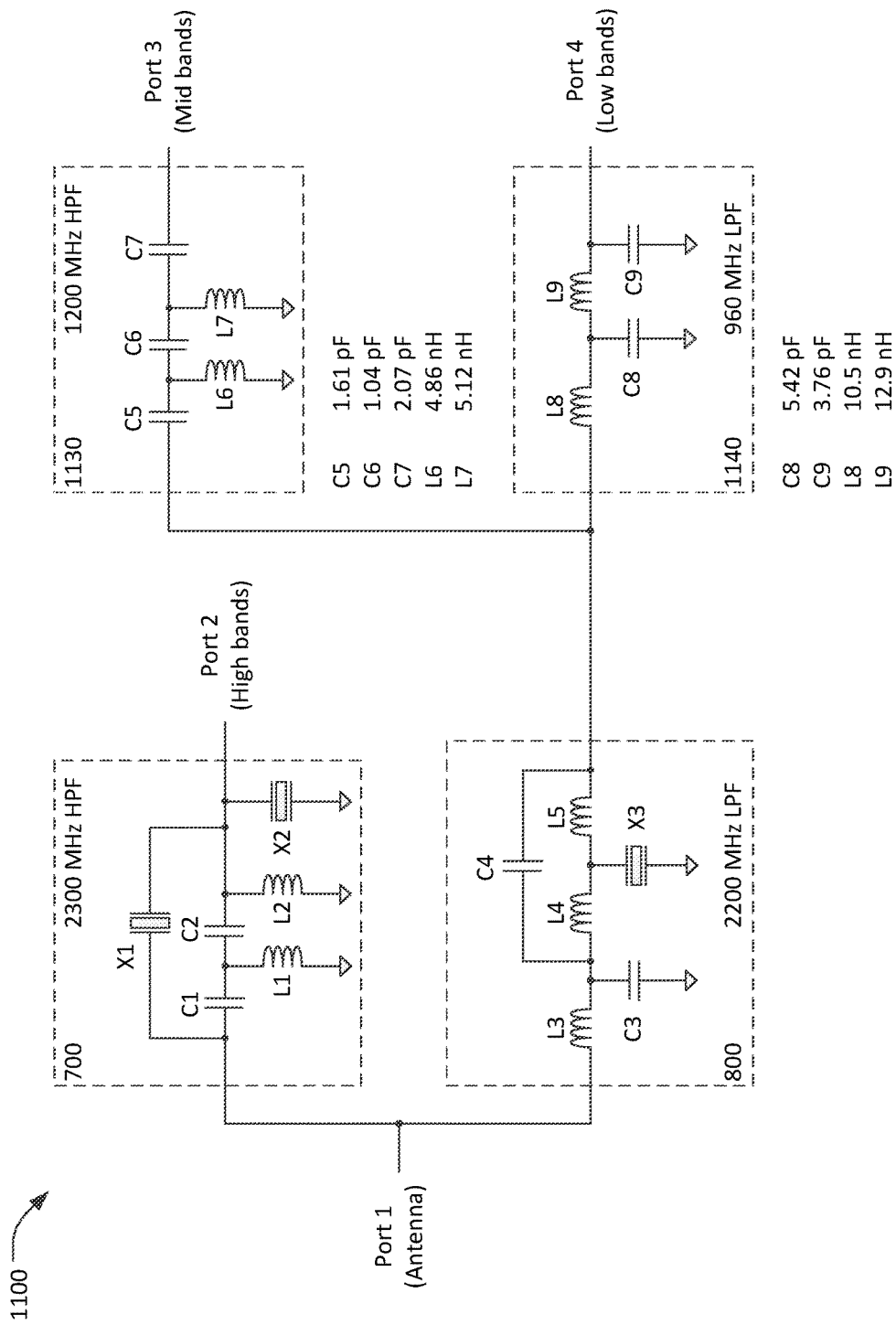
FIG. 11 is a schematic diagram of a triplexer suitable for use in the communication device of FIG. 3.

FIG. 11 is a schematic diagram of a highly selective triplexer 1100 suitable for use as the triplexer 320 in the communication device 300 of FIG. 3. A first port (antenna port) is connected to a high-pass filter 700 and a low-pass filter 800 as previously shown in FIG. 7A and FIG. 8A, respectively. The high-pass filter 700 is configured to pass frequencies above 2300 MHz with low insertion loss and to stop, or substantially attenuate, frequencies below 2200 MHz. The low-pass filter 800 is configured to pass frequencies below 2200 MHz with low insertion loss and to stop, or substantially attenuate, frequencies above 2300 MHz.

The output of the low pass filter 800 is further divided into mid and low frequency ranges by a second high-pass filter 1030 and a second low-pass filter 1040. The second high-pass filter 1030 is an LC filter configured to pass frequencies between 1200 MHz and at least 2200 MHz with low insertion loss and to stop, or substantially attenuate, frequencies below 960 MHz. The second low-pass filter 1040 is and LC filter configured to pass frequencies between 450 MHz and 960 MHz with low insertion loss and to reject, or substantially attenuate, frequencies above 1500 MHz.

Figure 12:
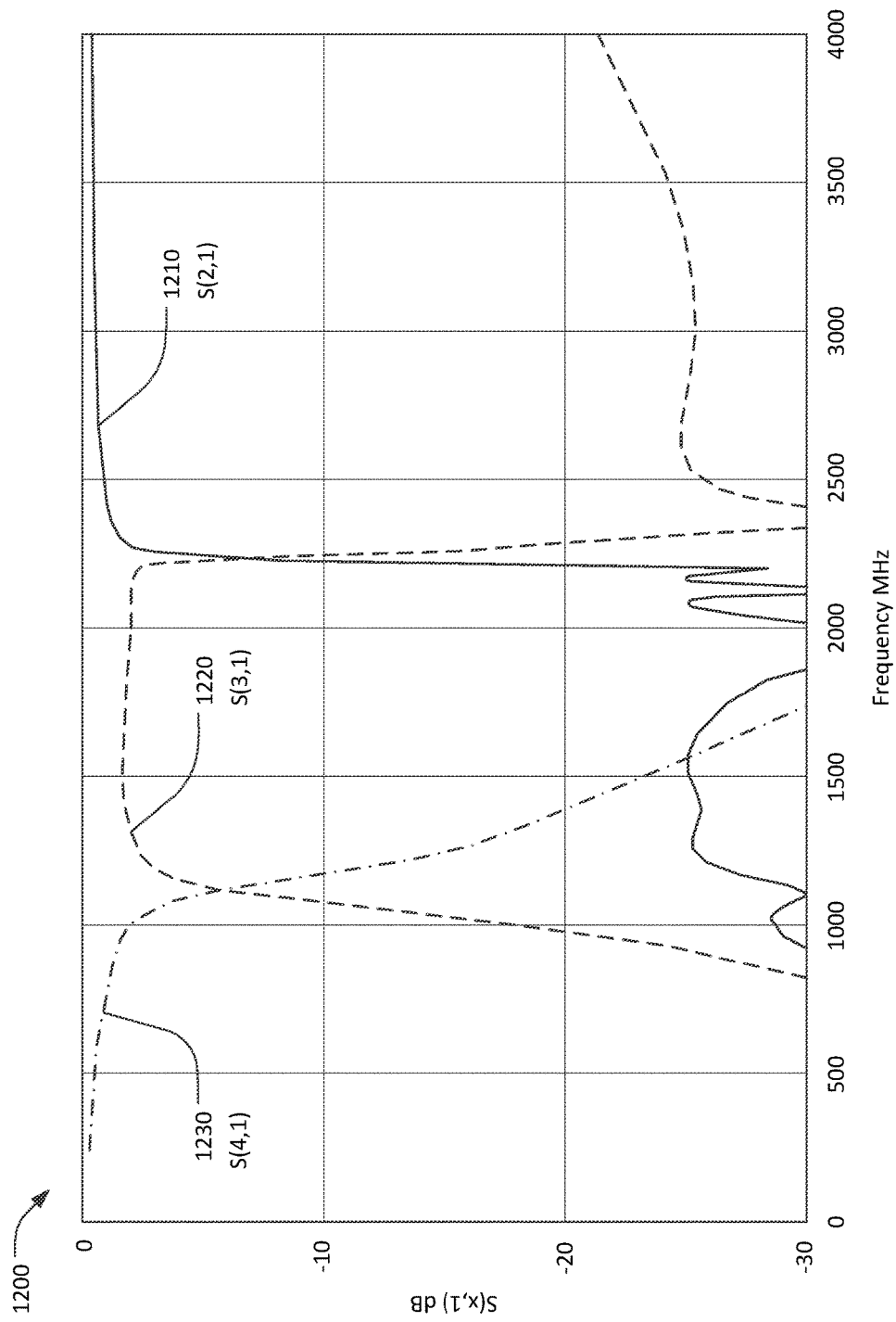
FIG. 12 is a chart showing S(2,1), S(3,1), and S(4,1) of the triplexer of FIG. 11.

FIG. 12 is a graph of S(2,1), S(3,1) and S(4,1) of the highly selective triplexer 1100 as derived by simulation of the circuit of FIG. 11. The solid line 1210 is a plot of the input-output transfer function from the antenna port (port 1)

to the high bands radio port (port 2) of the triplexer 1100. The dashed line 1220 is a plot of the input-output transfer function from the antenna port (port 1) to the mid bands radio port (port 3) of the triplexer 1100. The dot-dash line 1230 is a plot of the input-output transfer function from the antenna port (port 1) to the low bands radio port (port 4) of the triplexer 1100.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. A communications device, comprising:
a triplexer having a common port and first, second, and third branch ports;
wherein the triplexer comprises:
a hybrid LC/SAW high-pass filter connected between the common port and the third branch port;
a hybrid LC/SAW low-pass filter connected between the common port and an internal node;
an LC high-pass filter connected between the internal node and the second branch port; and
an LC low-pass filter connected between the internal node and the first branch port.

2. The communications device of claim 1, wherein
the hybrid LC/SAW low-pass filter and the LC low-pass filter are collectively configured to pass radio frequency signals in a frequency range of 450 MHz to 960 MHz between the common port and the first branch port,
the hybrid LC/SAW low pass filter and the LC high-pass filter are collectively is configured to pass radio frequency signals in a frequency range of 1500 MHz to 2200 MHz between the common port and the second branch port, and
the hybrid LC/SAW high pass filter is configured to pass radio frequency signals in a frequency range above 2300 MHz between the common port and the third branch port.

3. The communications device of claim 2, further comprising:
an antenna coupled to the common port;
a first radio coupled to the first branch port, the first radio configured to communicate over one or more channels within the frequency range of 450 MHz to 960 MHz;
a second radio coupled to the second branch port, the second radio configured to communicate over one or more channels within the frequency range of 1500 MHz to 2200 MHz; and
a third radio coupled to the third branch port, the third radio configured to communicate over one or more channels with frequencies above 2300 MHz.

4. The communications device of claim 2, wherein
the hybrid LC/SAW low-pass filter is configured to pass radio frequency signals in a range from 450 MHz to 2200 MHZ and to stop radio frequency signals in a range from 2300 MHz to at least 4000 MHz, and
the hybrid LC/SAW high pass filter is configured to pass radio frequency signals in a frequency range from 2300 MHz to at least 4000 MHz and to stop radio frequency signals in a range from 450 MHz to 2200 MHZ.

5. The communications device of claim 1, wherein the hybrid LC/SAW high-pass filter comprises:
an LC high-pass filter defining a stop-band and a pass-band separated by a transition frequency region; and
a SAW resonator connected in parallel with at least a portion of the LC high-pass filter, a resonance frequency of the first SAW resonator within the transition frequency region.

6. The communications device of claim 5, wherein
the LC high-pass filter comprises two or more series capacitors and two or more shunt inductors, and
the SAW resonator is connected in parallel with at least one of the two or more series capacitors.

7. The hybrid LC/SAW high-pass filter of claim 6, wherein
the LC high-pass filter comprises two series capacitors and two shunt inductors,
the first SAW resonator is connected in parallel with the two series capacitors, and
the hybrid LC/SAW filter further comprises a second SAW resonator connected in parallel with one of the shunt inductors.

8. The hybrid LC/SAW high-pass filter of claim 6, wherein
the LC high-pass filter comprises four series capacitors and three shunt inductors, and
the first SAW resonator is connected in parallel with three of the series capacitors.

9. The communications device of claim 1, wherein the hybrid LC/SAW low-pass filter comprises:
a bridged-T circuit including two inductors connected in series, a capacitor connected in parallel with the series-connected inductors, and a SAW resonator connected from a junction between the two inductors to ground.

10. The communications device of claim 9, further comprising:
a second capacitor and a third inductor forming a low-pass filter section in series with the bridged-T circuit.

11. A hybrid LC/SAW high-pass filter comprising:
an LC high-pass filter defining a stop-band and a pass-band separated by a transition frequency region, the LC high-pass filter comprising two or more series capacitors and two or more shunt inductors; and a first SAW resonator connected in parallel with at least one of the two or more series capacitors, a resonance frequency of the first SAW resonator within the transition frequency region.

12. The hybrid LC/SAW high-pass filter of claim 11, wherein
the LC high-pass filter comprises four series capacitors and three shunt inductors, and
the first SAW resonator is connected in parallel with three of the series capacitors.

13. The hybrid LC/SAW high-pass filter of claim 11, wherein
the LC high-pass filter comprises two series capacitors and two shunt inductors,
the first SAW resonator is connected in parallel with the two series capacitors, and
the hybrid LC/SAW filter further comprises a second SAW resonator connected in parallel with one of the shunt inductors.

14. A hybrid LC/SAW low-pass filter defining a stop-band and a pass-band separated by a transition region, comprising:
a bridged-T circuit including first and second inductors connected in series, a first capacitor connected in parallel with the series-connected first and second inductors; and
a shunt SAW resonator connected from a junction between the first and second inductors to ground, a resonance frequency of the shunt SAW resonator within the transition frequency region.

15. The hybrid LC/SAW low-pass filter of claim 14, further comprising:
a second capacitor and a third inductor forming a low-pass filter section in series with the bridged-T circuit.

16. A communications device, comprising:
a triplexer having a common port and first, second, and third branch ports;
wherein the triplexer comprises:
a hybrid LC/SAW high-pass filter connected between the common port and the third branch port;
a hybrid LC/SAW low-pass filter connected between the common port and an internal node;
an LC high-pass filter connected between the internal node and the second branch port; and
an LC low-pass filter connected between the internal node and the first branch port, and
the hybrid LC/SAW high-pass filter comprises:
an LC high-pass filter comprising two or more series capacitors and two or more shunt inductors, the LC high-pass filter defining a stop-band and a pass-band separated by a transition frequency region; and
a first SAW resonator connected in parallel with at least one of the two or more series capacitors, a resonance frequency of the SAW resonator within the transition frequency region.

17. The communications device of claim 16, wherein
the LC high-pass filter comprises two series capacitors and two shunt inductors,
the first SAW resonator is connected in parallel with the two series capacitors, and
the hybrid LC/SAW filter further comprises a second SAW resonator connected in parallel with one of the shunt inductors.

18. The communications device of claim 16, wherein
the hybrid LC/SAW low-pass filter and the LC low-pass filter are collectively configured to pass radio frequency signals in a frequency range of 450 MHz to 960 MHz between the common port and the first branch port,
the hybrid LC/SAW low pass filter and the LC high-pass filter are collectively configured to pass radio frequency signals in a frequency range of 1500 MHz to 2200 MHz between the common port and the second branch port, and
the hybrid LC/SAW high pass filter is configured to pass radio frequency signals in a frequency range above 2300 MHz between the common port and the third branch port.

19. The communications device of claim 18, further comprising:
an antenna coupled to the common port;
a first radio coupled to the first branch port, the first radio configured to communicate over one or more channels within the frequency range of 450 MHz to 960 MHz;
a second radio coupled to the second branch port, the second radio configured to communicate over one or more channels within the frequency range of 1500 MHz to 2200 MHz; and
a third radio coupled to the third branch port, the third radio configured to communicate over one or more channels with frequencies above 2300 MHz.

20. The communications device of claim 16, wherein
the LC high-pass filter comprises four series capacitors and three shunt inductors, and
the first SAW resonator is connected in parallel with three of the series capacitors.

21. A communications device, comprising:
a triplexer having a common port and first, second, and third branch ports;
wherein the triplexer comprises:
a hybrid LC/SAW high-pass filter connected between the common port and the third branch port;
a hybrid LC/SAW low-pass filter connected between the common port and an internal node;
an LC high-pass filter connected between the internal node and the second branch port; and
an LC low-pass filter connected between the internal node and the first branch port; and
wherein the hybrid LC/SAW low-pass filter comprises:
a bridged-T circuit including two inductors connected in series, a capacitor connected in parallel with the series-connected inductors, and a SAW resonator connected from a junction between the two inductors to ground.

22. The communications device of claim 21, further comprising:
a second capacitor and a third inductor forming a low-pass filter section in series with the bridged-T circuit.

23. The communications device of claim 21, wherein
the hybrid LC/SAW low-pass filter and the LC low-pass filter are collectively configured to pass radio frequency signals in a frequency range of 450 MHz to 960 MHz between the common port and the first branch port,
the hybrid LC/SAW low pass filter and the LC high-pass filter are collectively configured to pass radio frequency signals in a frequency range of 1500 MHz to 2200 MHz between the common port and the second branch port, and
the hybrid LC/SAW high pass filter is configured to pass radio frequency signals in a frequency range above 2300 MHz between the common port and the third branch port.

24. The communications device of claim 23, further comprising:

an antenna coupled to the common port;
a first radio coupled to the first branch port, the first radio configured to communicate over one or more channels within the frequency range of 450 MHz to 960 MHz;
a second radio coupled to the second branch port, the second radio configured to communicate over one or more channels within the frequency range of 1500 MHz to 2200 MHz; and
a third radio coupled to the third branch port, the third radio configured to communicate over one or more channels with frequencies above 2300 MHz.

* * * * *